United States Patent

Shimizu

[11] Patent Number: 5,637,435
[45] Date of Patent: Jun. 10, 1997

[54] NEGATIVE TYPE LITHOGRAPHIC PRINTING PLATE

[75] Inventor: Shigeki Shimizu, Atugishi, Japan

[73] Assignee: Mitsubishi Chemical Corporation, Tokyo, Japan

[21] Appl. No.: 682,962

[22] Filed: Apr. 10, 1991

[30] Foreign Application Priority Data

Apr. 10, 1990 [JP] Japan ................................ 2-094322

[51] Int. Cl.$^6$ ....................................... G03F 7/021
[52] U.S. Cl. ........................ 430/156; 430/158; 430/160; 430/175; 430/176; 430/302
[58] Field of Search ................................. 430/156, 160, 430/175, 158, 157, 162, 176, 302

[56] References Cited

U.S. PATENT DOCUMENTS

| 3,479,182 | 11/1969 | Chu | 430/156 |
| 4,104,072 | 8/1978 | Golda et al. | |
| 4,588,669 | 5/1986 | Asano | 430/156 |
| 4,612,276 | 9/1986 | Browne | 430/156 |
| 4,687,727 | 8/1987 | Toyama et al. | 430/156 |
| 4,886,731 | 12/1989 | Sypek et al. | 430/156 |
| 4,956,261 | 9/1990 | Pawlowski et al. | 430/175 |

FOREIGN PATENT DOCUMENTS 2081916  2/1982  United Kingdom.

*Primary Examiner*—John S. Chu
*Attorney, Agent, or Firm*—Oblon, Spivak, McClelland, Maier & Neustadt, P.C.

[57] ABSTRACT

A negative-type photosensitive lithographic printing plate having a photosensitive layer comprising upper and lower layers, each layer containing a photosensitive diazo resin, on a support having a hydrophilic surface. The concentration of the diazo resin in the upper layer is not more than ⅓ of the concentration of the diazo resin in the lower layer, the thickness of the upper layer is not less than three times the thickness of the lower layer, and the upper layer contains an oleophilic non-photosensitive resin with a weight average molecular weight ranging from 10,000 to 150,000. The lithographic printing plate has a very short exposure time, may be used with projection exposure systems and allows for the use of known developers and automated developer systems.

24 Claims, No Drawings

NEGATIVE TYPE LITHOGRAPHIC PRINTING PLATE

BACKGROUND OF THE INVENTION

1. Field of the Invention

The present invention relates to a novel highly sensitive photosensitive lithographic printing plate and, more specifically, it relates to a highly sensitive photosensitive lithographic printing plate particularly suitable to projection exposure.

2. Discussion of the Background

Heretofore, exposure of a photosensitive lithographic printing plate has been conducted by bringing a photosensitive printing plate into close contact with an equal size silver halide film and, subsequently, irradiating with intense UV-radiation. In recent years, a projection exposure device for enlarging an image on original film has been used, by utilizing an optical system and printing on a photosensitive lithographic printing plate.

The magnifying ratio in the projection exposure method is about 3 to 10 times, by which the area of the silver halide film used can be reduced to 1/9–1/100 as compared with the conventional contact method. Further, since there is no requirement for close contact of a printing frame, the time required for vacuum contact (usually about 30 sec to 2 min) can be eliminated in the projection exposure method.

Furthermore, since original film (usually microfilm) is small in size and lightweight, films can be selected and aligned automatically, thereby eliminating laborious selection and alignment operations.

A photosensitive layer having a double layer structure is disclosed in Japanese Patent Laid-Open Sho 53-145706, 57-38481 and 58-2847, but the structure disclosed in each of these references is intended for development with tap water and none mentions increasing sensitivity by 10–50 times which is required for projection exposure.

For instance, Japanese Patent Laid-Open Sho 53-145706 and 57-38431 each relate to a lithographic plate having a double layer structure containing a diazo photosensitive material. The thickness of the lower layer is disclosed as being from 0.5 to 21.5 mg/dm$^2$, while the thickness of the upper layer is from 0.5 to 32.2 mg/dm$^2$. Further, the diazo concentration in the lower layer is from 1 to 99%, while the diazo concentration in the upper layer is from 2 to 90%, and the ratio of the thicknesses and the ratio of the diazo concentrations between the upper layer and the lower layer are not mentioned. In Japanese Patent Laid-Open Sho 58-2847, it is stated that the thickness of the lower layer is from 1 to 30 mg/dm$^2$, while the thickness of the upper layer is from 0.5 to 40 mg/dm$^2$, and that the diazo concentration in the lower layer is from 1 to 50%, while the diazo concentration in the upper layer is from 1 to 50%.

Use of projection exposure systems has not yet been popularized, in spite of its various merits, partly because the photosensitive printing plate lacks sensitivity.

A lithographic printing plate for contact exposure requires about 30 sec to 2 min for vacuum contact before the light exposure, as well as about the same amount of time for exposure itself. However, in order to effectively utilize a projection exposure device, it is only necessary that the exposure time be about 2 to 5 sec. That is, there has been a demand for the development of a lithographic printing plate of higher sensitivity as compared with the conventional contact exposure printing plate, more specifically, a lithographic printing plate with UV irradiation energy requirements of 5 to 25 mj/cm$^2$ and having a sensitivity as high as 10 to 50 times compared with the irradiation energy of existing photosensitive lithographic printing plates for contact exposure (200 to 500 mj/cm$^2$). Further, micro-projection exposure devices have been introduced mainly into the field of monochromatic printing, in which an additive-type plate is used in addition to a subtractive type plate. It is desirable to use developers and automatic developing machines, which are now used for contact exposure, for projection exposure also.

SUMMARY OF THE INVENTION

In view of the above, the present inventors have made an earnest study and, as a result, have accomplished the present invention based on the finding that the objects noted above can be obtained by using a photosensitive layer comprising upper and lower layers containing a photosensitive diazo resin and by adopting a specific constitution for the concentration of the photosensitive diazo resin and the thickness in the upper and lower layers. That is, one object of the present invention is to provide a lithographic printing plate, which may be used in the projection exposure method, having excellent sensitivity. A second object is to provide a highly sensitive lithographic printing plate, which may be used with known developers and automatic developing apparatus.

The foregoing objects of the present invention are attained by the present negative type lithographic printing plate for projection exposure in which a photosensitive layer comprising upper and lower layers containing a photosensitive diazo resin is coated on a support having a hydrophilic surface. The concentration of the diazo resin in the upper layer is not more than 1/3 of that in the lower layer, the thickness of the upper layer is not less than three times as great as the thickness of the lower layer. The upper layer also contains an oleophilic non-photosensitive resin with a weight average molecular weight ranging from 10,000 to 150,000.

DETAILED DESCRIPTION OF THE PREFERRED EMBODIMENT

In the double layer structure according to the present invention, the diazo photosensitive material present at a high concentration contained in the thin lower photosensitive layer causes adhesion with a substrate to form an image by light exposure. Since the upper layer also remains in the light-irradiated portion and serves as an ink deposition layer, it is necessary that the thickness of the upper layer be greater than the thickness of the lower layer.

The light exposed portion of the diazo photosensitive material contained at a lower concentration in the upper layer causes a weak crosslinking reaction, blocking the invasion of a developer into the lower layer.

In this way, by localizing the diazo material at a high concentration only in the thin lower layer, an image can be sufficiently formed even though the total amount of the diazo photosensitive materials in both of the layers is small. The amount of light required for reacting the small amount of the diazo photosensitive material is reduced, so that a highly sensitive lithographic plate suitable for projection exposure is obtained. Further, none of the known literature described above discloses the feature of the present invention in which processing is possible with either a subtractive-type developer or an additive-type developer.

As a support or substrate usable in the present invention, there can be mentioned, for example, an aluminum plate, zinc plate, copper plate, iron plate, plastic film vapor deposited with metal, and paper or plastic film treated to have hydrophilic properties. Aluminum plate is preferred and it is particularly desirable that the surface of the plate be made more hydrophilic by graining, anodization and, if required, pore-sealing treatment.

Graining may be accomplished by degreasing the surface of an aluminum plate and, subsequently, by any optional known method such as brushing, ball grinding, chemical polishing and electrolytic polishing.

Anodization is performed by dipping a grained aluminum plate in an aqueous solution of an inorganic acid such as phosphoric acid, chromic acid, boric acid or sulfuric acid, or an organic acid such as oxalic acid or sulfamic acid, or a mixture of such acid and supplying an electric current using the aluminum plate as an anode according to known methods.

Pore sealing is performed by dipping the anodized aluminum plate in an aqueous solution of sodium silicate, an aqueous solution of an organic salt or inorganic salt or in hot water. Graining, anodization and pore sealing methods are well known in the art.

Then a photosensitive coating on the thus obtained support or substrate is formed in the manner described below.

A first photosensitive composition containing a photosensitive diazo resin is coated on the thus obtained substrate to form a lower photosensitive layer. Subsequently, a second photosensitive composition with a low concentration of the photosensitive diazo resin is coated to form an upper photosensitive layer, to thereby obtain a highly sensitive negative-type lithographic printing plate.

Preferably, the concentration of the diazo resin in the lower layer is not less than 10 wt. %, preferably 20 to 100 wt. % and, particularly preferably, 50 to 100 wt. %, and the thickness of the lower layer is not more than 2 mg/dm$^2$, preferably, from 0.01 to 1 mg/dm$^2$ and, particularly preferably, from 0.05 to 0.5 mg/dm$^2$.

When the thickness of the lower layer is not more than 0.5 mg/dm$^2$, the thickness of the layer can be measured conveniently with good accuracy by measuring the characteristic absorption of the diazo resin (300 to 450 nm) using a UV spectral analyzer equipped with a diffusion reflection device. For instance, when coating a zinc chloride complex salt of a diphenylamine diazonium-formaldehyde resin on a grained support plate, when the UV absorption at 370 nm is increased by 0.1, after the coating, the thickness is calculated as shown below.

Absorption increase of 0.1=Mmol/cm$^2$ (surface density)×30,000 (molar absorption coefficient)

The diazo mole number per unit area (M)=0.1÷30,000, the density of the diazo resin is approximately 1, and, in the case where 30,000 is used as the molar absorption coefficient, the equivalent number of the zinc chloride complex salt of the diazo resin is 324, therefore:

$$\text{Thickness} = \frac{0.1 \times 324}{30,000 \times 1,000} \text{ cm} \approx 10^{-6} \text{ cm} = 0.01 \text{ micron,}$$

where 0.01 micron corresponds to 0.1 mg/dm$^2$.

Preferably, the concentration of the diazo resin in the upper layer is not more than 20 wt. %, more preferably, from 0.01 to 10 wt. % and, particularly preferably, from 0.01 to 5 wt. %, and that the thickness of the upper layer is from 0.5 to 20 mg/dm$^2$ preferably 1 to 10 mg/dm$^2$ and, particularly preferably, 1 to 6 mg/dm$^2$. In the present invention, the concentration of the diazo resin in the upper layer is not more than ⅓, preferably, not more than ⅕ of that in the lower layer within the above-mentioned ranges. If the diazo resin is not contained at all in the upper layer, the surface of the image area can not be photocured to reduce the sensitivity.

The thickness of the upper layer is not less than three times, preferably, five times that of the lower layer.

If the thickness of the upper layer is not 20 mg/dm$^2$ or less, the amount of laquer deposition becomes excessive, tending to reduce the image reproducibility upon treating with an additive type developer liquid and, accordingly, it is preferably selected to be not more than 20 mg/dm$^2$.

As the diazo resin that can be used in the present invention, any water soluble or organic solvent soluble resin is possibly used. Such resins are well known in the art.

The diazo resin may be obtained by condensing a diazo monomer alone or as a mixture of two or more monomers with an active carbonyl compound such as formaldehyde or acetaldehyde. The diazo monomer usable herein may include, for example, p-diazo-diphenylamine, 4-diazo-4'-methoxyphenylamine, 4-diazo-4'-methyldiphenylamine, 4-diazo-4'-chlorodiphenylamine, 3-diazo-4,4'-dimethyldiphenylamine, 4-diazo-2-carboxydiphenylamine, 1-diazo-2-phenoxy-5-chlorobenzene, 1-diazo-4-N,N-dimethylbenzene, and 1-diazo-4-morpholinobenzene.

As a water soluble diazo resin, there can be mentioned the soluble salts of the diazo resins noted above, for example, the chloride, sulfate, borohydro fluoride salts and complex salts of the resin with zinc chloride.

As a diazo resin soluble in an organic solvent, there can be mentioned inorganic acid salts, of the diazo resins noted above, such as hexafluoro phosphate and tetrafluoro borate salts and as organic acid salts para-toluenesulfonate and benzene phosphinate salts.

Upon coating the upper and the lower photosensitive layers, a non-photosensitive water soluble or organic solvent soluble resin can be used in admixture in addition to the diazo resin.

The concentration of the non-photosensitive resin is not more than 50 wt. %, preferably not more than 30 wt. % in the lower layer, while not less than 50 wt. % and, preferably not less than 70 wt. % in the upper layer.

Generally, a diazo resin and a non-photosensitive resin having similar solubility are combined together into a solution and coated. Since ink receptability is required for the upper layer, a combination of an organic solvent soluble diazo resin and an oleophilic resin is desirable and, accordingly, a water soluble diazo resin which tends to be insoluble upon coating the upper layer is preferably used for the lower layer.

As the non-photosensitive water soluble resin, natural and synthetic polymeric compounds are used and they include, for example, gum arabics, cellulose ethers, polyacrylic acids, polymethacrylic acids, polyacrylamides, polyvinyl pyrrolidones, polyvinyl alcohols and maleic acid copolymers.

As the non-photosensitive oleophilic resin, there may be used, for example, a polyester, polyurethane, polyvinyl butyral, epoxy resin, polyacrylate, polymethacrylate, polystyrene, novolac resin or cellulose acetate. For forming a printing plate material that can be treated with any of the subtractive developers and the additive developers, it is preferred to use a polyacrylate, in particular, a copolymer of an alkyl acrylate and an alkyl methacrylate preferably lower alkyl (meth)acrylates. The molecular weight of the copolymer, expressed by weight average is generally from 10,000 to 150,000, preferably, 10,000 to 100,000.

If the molecular weight of the copolymer used in the upper layer is less than 10,000, it tends to be difficult to attain the sensitivity required for projection exposure. On the other hand, if it exceeds 150,000, the developability is reduced and, in particular, the non-image area tends to be stained under long time storage.

A stabilizer for the diazo resin may be added to both of upper and lower photosensitive layers. In particular, it is desirable to add a stabilizer to the lower layer for maintaining the stability of the diazo resin at the boundary with the aluminum. The concentration of the stabilizer added ranges about from 0.1 to 10 wt. % for the upper layer and from 10 wt. % to 70 wt. % for the lower layer.

As a stabilizer used herein, there can be mentioned, for example, organic compounds such as polyacrylic acid, tartaric acid, citric acid, oxalic acid, benzenesulfonic acid and naphthalenesulfonic acid, and inorganic compounds such a phosphoric acid, phosphorous acid and zinc chloride. Among them, polyacrylic acid and phosphoric acid are particularly preferred.

The upper and the lower photosensitive layers may also incorporate a colorant such as a dye or a pigment.

As a solvent used for coating the lower and the upper layers, there can be mentioned, in addition to water, lower alcohols such as methanol, ethanol and isopropanol, cellosolves such as methyl cellosolve, methyl cellosolve acetate, ethyl cellosolve and ethyl cellosolve acetate, ketones such as acetone, cyclohexanone and methyl ethyl ketone, dioxane, tetrahydrofuran, propylene glycol monomethyl ether, ethyl acetate, methyl lactate and ethyl lactate. They may be used alone or as mixtures.

Coating can be done using any of the known methods such as rotational coating, wire bar coating, dip coating, air knife coating, roll coating, blade coating and curtain coating. It is important when coating the upper layer on a thin lower layer that both of the layers are not mixed together. Accordingly, it is preferred to coat one of them as an aqueous solution and the other of them as a solution of an organic solvent. More preferably, the upper layer may be coated by organic solvent, since it needs ink receptability.

The thus obtained photosensitive lithographic printing plate is exposed through a transparent negative original by means of a super high pressure mercury lamp, metal halide lamp, xenon lamp or the like, in which projection exposure is particularly preferred. As examples of the exposing machines, PAGINATOR (Rachwall Co., U.S.A.), SAPP (Dainippon Screen Co., Japan), IMPOSER (OPTI-COPY Co., U.S.A.), RIVAPHONE CAMERA (Mouri Manufacturing Co., Japan), etc. are commercially available. The exposure time is from 1 to 20 sec, particularly, 2 to 5 sec.

The developing operation after exposure may use any of subtractive-type developers or additive-type developers. The subtractive-type developer may be one obtained by dissolving in water, an organic solvent, an alkali, a surface active agent and the like. For developing, the subtractive-type developer is applied by dipping a printing plate in the developer and rubbing the surface of the plate with a soft cloth or brush. The photosensitive layer at the exposed area remains as it is to constitute an ink receiving layer, whereas the photosensitive layer in the non-exposed area is leached out to expose grains and form a non-image area.

The additive-type developer comprises in addition to the ingredients contained in the subtractive-type developer, a lacquer ingredient, such as an epoxy resin, for reinforcing the image area and an oil-insensitive ingredient, such as gum arabic, for reinforcing the hydrophilic properties of the non-image area.

During development, the exposed area remains, while the non-exposed area is leached out. Further, an oleophilic lacquer ingredient deposits on the remaining image area, while the hydrophilic oil-insensitized ingredient deposits on the grains in the non-image area. The thus developed printing plate may be used with an ordinary offset printer.

Other features of the invention will become apparent in the course of the following descriptions of exemplary embodiments which are given for illustration of the invention and are not intended to be limiting thereof. Hereinafter, "%" means "% by weight" unless otherwise specified.

EXAMPLES (a) Synthesis for Water Soluble Diazo Resin

P-diazophenylamine sulfate salt 14.5 g (50 mmol) was dissolved into 40 g of concentrated sulfuric acid under ice cooling. 1.05 g (35 mmol) of p-formaldehyde was added slowly to the reaction solution and the reaction temperature was controlled so as not to exceed 10° C. After continued stirring under ice cooling for 2 hours, the reaction solution was added to 500 ml of ethanol and the resultant precipitates were recovered by filtration. After washing the precipitates with ethanol, they were dissolved into 100 ml of purified water, to which an aqueous solution containing 6.8 g of dissolved zinc chloride was added. After separating the resultant precipitates by filtration, they were washed with ethanol and dried at 25° C. for 3 hours to obtain 15 g of a complex salt of the diazo resin with zinc chloride.

(b) Synthesis of Organic Solvent-Soluble Diazo Resin

After dissolving 15 g of the complex salt of the diazo resin with zinc chloride into 150 ml of purified water, an aqueous solution containing 8 g of dissolved ammonium hexafluoro phosphate was added, and the resultant precipitates were separated by filtration. After washing the precipitates with water and ethanol, they were dried at 25° C. for three hours to obtain 12.5 g of diazo resin hexafluoro phosphate salt.

After conducting a coupling reaction, under the following conditions, the molecular weight of the resultant diazo resin was measured by gel permeation chromatography (GPC).

After dissolving 0.2 g of the diazo resin into 25 ml of acetonitrile, a solution containing 0.2 g of 1-phenyl-3-methyl-5-pyrazolone dissolved in acetonitrile was added at room temperature. Then, 2 ml of an aqueous 1% ammonia solution was added and, after stirring for 30 min, the reaction product was recovered by filtration, washed with 50 ml of water and then dried at 50° C. over one day and one night. The weight average molecular weight of the diazo resin obtained was 1530.

(c) Synthesis of Non-Photosensitive Acrylate Copolymer (1) Under a nitrogen gas stream, 120 g of methyl methacrylate, 60 g of ethyl acrylate and 3.0 g of a polymerization initiator azoisobutyronitrile (AIBN) were dissolved into a mixed solvent comprising 120 g of acetone and 120 g of methanol and refluxed with stirring at 60° C. for 6 hours. After the reaction was over, the reaction solution was added to water to precipitate the polymer compound, which was dried at 50° C. under vacuum over one day and one night, to obtain 160 g of the copolymer. The copolymer was dissolved in tetrahydrofuran (THF) and, when the molecular weight was measured by GPC, the weight average molecular weight was 50,000 converted as polystyrene, (2) Polymerization was conducted as in (1) above, except for reducing the amount of AIBN to 1.6 g, to obtain a copolymer with a weight average molecular weight of 70,000.

(3) Polymerization was conducted as in (1) above, except for reducing the amount of AIBN to 0.16 g, to obtain a copolymer with a weight average molecular weight of 200,000.

(4) By the same procedures as those in (1) above, 120 g of methyl methacrylate and 80 g of ethyl acrylate were mixed into 240 g of dioxane, to which 2.8 g of AIBN was added and reacted under stirring at a 85° C. for 6 hours, to obtain a copolymer with a weight average molecular weight of 7,000.

(d) Preparation of Brush-Grained Plate

An aluminum plate was sand-grained by using a nylon brush and a liquid suspension containing 40 mesh pumice stone. Then, the plate was etched in an aqueous 5% solution of sodium hydroxide at 50° C. for 10 sec, washed with water, neutralized and washed with 10% nitric acid. Subsequently, the plate was anodized in a 30% sulfuric acid bath at 30° C. and 2.5 A/dm$^2$ for 2 min and, subsequently, treated to effect pore sealing in an aqueous 2% solution of sodium metasilicate at 80° C. for 20 sec, to obtain brushed grains.

(e) Preparation of Electrolysis Grains

After electrolytically polishing an aluminum plate in a 2% hydrogen chloride solution at 25° C. and under a current density of 50 A/dm$^2$ for one minute, the plate was dipped into an aqueous 5% solution of sodium hydroxide and washed with water.

Then, anodization and pore sealing were conducted under the same conditions as those in (d) above to obtain a plate having electrolysis grains.

Example 1

A photosensitive solution containing 10 g of the complex salt of the diazo resin with zinc chloride and 2.5 g of phosphoric acid dissolved in 1.0 liter of purified water was coated by using a roll coating device onto a brush-grained plate prepared as in (d) above, to form a lower photosensitive layer with a thickness of 0.1 mg/dm$^2$. Then, a photosensitive solution containing 1 g of methyl methacrylate-ethyl acrylate copolymer synthesized in (b) above (molar ratio 67/33%, weight average molecular weight of 50,000) and 25 mg of the diazo resin hexafluoro phosphate salt synthesized in (b) above, dissolved in 100 ml of methyl cellosolve, was coated by using a whirl coater onto the grained plated coated with the lower layer, to form an upper coating layer with a thickness of 2.0 mg/dm$^2$. When the thus obtained photosensitive lithographic printing plate was exposed for 4.5 sec by using SUPER 70 PAGIN (manufactured by Rachwall Co.), developed with an additive developer (ENVIROTECH RED DEVELOPER, manufactured by Western Lithotech Co.), and it was put onto an offset rotary press (HARRIS WEB PRESS), preferred printed material could be obtained with no trouble up to the completion of 50,000 sheets.

In the same manner, when the thus exposed lithographic printing plate was developed with a subtractive-type developer (DURATETEK DEVELOPER, manufactured by Western Lithotech Co.), a preferred printing plate was formed. When it was put onto a sheet offset printer (PARVA, manufactured Roland Co.), preferred printed material was obtained with no trouble up to completion of 20,000 sheets.

Then, after leaving the non-exposed photosensitive lithographic printing plate in an oven at high temperature and high humidity (40° C., 80% relative humidity (RH)) for 2 days and exposing it with ENVIROTECH RED DEVELOPER, satisfactory developability was shown with no coloration for the non-image area.

Comparative Example 1

A photosensitive lithographic printing plate was prepared under the same conditions as those in Example 1, except for using, as a methyl methacrylate-ethyl acrylate copolymer (molar ratio 60/40) for the upper layer coating solution, a polymer having a weight average molecular weight of 7,000 synthesized in (c) above. When the plate was exposed using SUPER PAGINATOR at six steps of 2, 4, 7, 10, 15 and 20 sec and treated with an additive developer (ENVIROTECH RED DEVELOPER), sensitivity was insufficient and fine dots disappeared in each of the cases, to obtain only unsatisfactory images.

Comparative Example 2

A photosensitive lithographic printing plate was prepared under the same conditions as those in Example 1, except for using, as a methyl methacrylate-ethyl acrylate copolymer (molar ratio 67/33) for the upper layer coating solution, a copolymer having the weight average molecular weight of 200,000 synthesized in (c) above.

After leaving the thus obtained photosensitive lithographic printing plate in an oven at a high temperature and high humidity of 40° C. and 80% RH for 2 days, the plate was exposed and developed (ENVIROTECH RED DEVELOPER), the non-image area was colored red and unsatisfactory developability was exhibited.

Comparative Example 3

After coating a lower photosensitive layer onto a brush-grained plate under the same conditions as those in Example 1, an upper photosensitive layer was coated to a thickness of 2.0 mg/dm$^2$ by a whirl coater by using a light sensitive solution containing 1 g of the methyl methacrylate-ethyl acrylate copolymer with a weight average molecular weight of 50,000 synthesized in (c) above and 0.25 g of diazo resin-hexafluoro phosphate salt synthesized as in (b) above and dissolved in 100 ml of methyl cellosolve. When the thus obtained photosensitive lithographic printing plate was exposed using the SUPER PAGINATOR for 10, 15 and 20 sec and treated with an additive liquid developer (ENVIROTECH RED DEVELOPER), only unsatisfactory images with fine dots being eliminated were obtained.

Comparative Example 4

30 g of diazo resin-zinc chloride and 10 g of phosphoric acid were dissolved in 1.0 liter of water and coated onto a brush-grained plate using a roll coater to form a lower layer with a thickness of 1.5 mg/dm$^2$ and subsequently, an upper coating layer was formed to a thickness of 2.0 mg/dm$^2$ under the same conditions as those in Example 1.

After imagewise exposure for 10 sec, 15 sec and 20 sec in a SUPER PAGINATOR, the plates were treated with an additive developer (ENVIROTECH RED DEVELOPER), but only images of insufficient sensitivity and with fine dots being eliminated could be obtained.

Example 2

12 g of diazo resin-zinc chloride and 2.5 g of phosphoric acid were dissolved in 1.0 liter of water and coated to a thickness of 0.3 mg/dm$^2$ on an electrolysis grained plate prepared in (e) above, to form a lower photosensitive layer.

Then, a photosensitive solution containing 1 g of the methyl methacrylate-methyl acrylate copolymer (molar ratio 67/33) with a weight average molecular weight of 70,000 prepared in (c) above, and 25 mg of the diazo resin-hexafluoro phosphate salt prepared in (b) above, dissolved in 100 ml of methyl cellosolve, was coated to a thickness of 5.5 mg/dm$^2$, to form an upper light sensitive layer. When the thus obtained photosensitive lithographic printing plate was exposed imagewise for 3.5 sec using SUPER PAGINATOR and treated with a subtractive-type developer of the following composition, satisfactory images were formed.

The energy in 3.5 sec exposure by SUPER PAGINATOR was 10 mj/cm$^2$.

Subtractive Type Liquid Developer

| | |
|---|---|
| Water | 70.7% |
| Benzyl alcohol | 14.2% |
| Sodium dodecyl benzenesulfonate | 1.4% |
| Sodium xylenesulfonate | 10% |
| Ammonium sulfite | 2.3% |
| Ammonium phosphite | 1.4% |

Example 3

10 g of diazo resin-zinc chloride and 2.5 g of phosphoric acid were dissolved in 1.0 liter of water and coated to a thickness of 0.15 mg/dm$^2$ onto a brush grained plate.

Then, a photosensitive solution containing 1 g of the methyl methacrylate-methyl acrylate copolymer (molar ratio 67/33) with a weight average molecular weight of 70,000 prepared in (c) above, and 25 mg of the diazo resin-hexafluoro phosphate salt prepared in (b) above, dissolved in 100 ml of methyl cellosolve, was coated to a thickness of 3.5 mg/dm$^2$, to form an upper light sensitive layer.

When the thus obtained photosensitive lithographic printing plate was exposed imagewise using SUPER PAGINATOR and treated with an additive type developer of the following composition, satisfactory images were formed after exposure for 4.5 sec.

Additive Type Developer

| | |
|---|---|
| Benzyl alcohol | 5.6% |
| Epoxy resin | 1.2% |
| γ-butyrolactone | 8.8% |
| Dextrin | 2.2% |
| Gum arabic | 15.7% |
| Ethylene glycol | 10.6% |
| Surface active agent | 1.1% |
| Phosphoric acid | 0.5% |
| Talc | 18.4% |
| Red pigment | 1.4% |
| Water | 34.5% |

Comparative Example 5

A lower layer and an upper layer were coated onto a brush-grained plate under the same conditions as those in Example 3, except for using a photosensitive solution comprising only the copolymer with no addition of the diazo resin for the upper layer coating.

The resultant photosensitive lithographic plate was imagewise exposed for 3 sec, 5 sec, 7 sec and 10 sec by using SUPER PAGINATOR and treated with the additive type developer in the same manner as in Example 3, but the sensitivity was insufficient and only the images with fine dots being eliminated were obtained.

Example 4

A photosensitive composition comprising 10 g of the complex salt of diazo resin with zinc chloride prepared as in (a) above and 10 g of phosphoric acid dissolved in 1.0 liter of purified water was coated on the brush-grained plate prepared in (d) above, to a thickness of 0.6 mg/dm$^2$ using a roll coater (LITHOCOATER, manufactured by Western Lithotech Co.), to form a lower photosensitive layer.

Then, a photosensitive composition comprising 1 g of the acrylate copolymer prepared in (c2) and 25 mg of the diazo resin-hexafluoro phosphate salt prepared in (b) above was coated onto a substrate coated with the lower layer by using a whirl coater to form an upper photosensitive layer with a thickness of 2.0 mg/dm$^2$.

The thus obtained photosensitive lithographic printing plate was exposed through a negative using a RIVAPHONE CAMERA (manufactured by Mouri Manufacturing Co.) and developed using a developing brush while dipping the printing plate in a liquid developer of the following composition:

Developer Composition

| | |
|---|---|
| Water | 68.7% |
| Gum arabic | 1% |
| Hydroxyethyl cellulose | 1% |
| Benzyl alcohol | 14.2% |
| Sodium dodecyl benzenesulfonate | 1.4% |
| Sodium xylenesulfonate | 10% |
| Ammonium sulfite | 2.3% |
| Ammonium phosphite | 1.4% |

The exposure energy required for obtaining the third solid step print by a step wedge was 10 mj/cm$^2$. When the thus obtained lithographic printing plate was put onto an offset printer (PARVA, manufactured by Roland Co.), satisfactory printed material was obtained up to the completion of 70,000 sheets.

Comparative Example 6

A photosensitive composition comprising 30 g of the salt of the diazo resin with zinc chloride prepared in (a) above and 30 g of phosphoric acid dissolved in 1.0 liter of purified water was coated on the brush-grained plate prepared in (d) above by using a roll coater, to form a lower photosensitive layer with a thickness of 1.5 mg/dm$^2$. An upper photosensitive layer with a thickness of 2.0 mg/dm$^2$ was formed on the substrate under the same conditions as those in Example 4 and then exposed and developed. The exposure energy required for obtaining the third solid step print was 100 mj/cm$^2$.

Comparative Example 7

A brush-grained plate formed with a lower light sensitive layer in the same procedure as those in Example 4 was prepared. Then, a photosensitive composition comprising 0.5 g of the acrylate copolymer prepared as in (c)-(2) above and 12 mg of the diazo resin hexafluoro phosphate salt prepared as in (b) above, dissolved in 100 ml of methyl cellosolve, was coated thereover by a whirl coater to form an upper photosensitive layer with a thickness of 0.5 mg/dm$^2$. The thus obtained photosensitive lithographic printing plate was exposed and developed by the same procedures as those in Example 4 and, thereafter, put onto an offset printer. Irregularity and unevenness was caused due to ink deposition in the image area and no satisfactory printed material was obtained.

Example 5

2 g of the complex salt of the diazo resin with zinc chloride prepared as in (a) above and 4 g of phosphoric acid were dissolved in 1.0 liter of water to form a lower photosensitive layer with a thickness of 0.5 mg/dm$^2$ onto an electrolysis grained plate prepared as in (e) above. Then, a photosensitive composition comprising 1 g of an epoxy resin (EPON 1001, manufactured by Shell Co.) and 25 mg of the diazo resin-hexafluoro phosphate prepared as in (b) above, dissolved in 100 mg of methyl cellosolve, was coated thereover by using a whirl coater to obtain an upper photosensitive layer with a thickness of 2.5 mg/dm$^2$.

When the thus obtained photosensitive lithographic printing plate was exposed and developed in the same manner as in Example 1, the energy required for obtaining the third step solid print was 20 mj/cm$^2$.

Example 6

An electrolysis grained plate coated with a lower photosensitive layer in the same procedure as in Example 5 was prepared. A photosensitive composition comprising 1 g of a novolac resin (CKM-2400, manufactured by Union Carbide CO.) and 25 mg of the diazo resin hexafluoro phosphate salt prepared as in (b) above, dissolved in 100 ml of methyl cellosolve, was coated thereover by a whirl coater, to obtain an upper photosensitive layer with a thickness of 3.0 mg/dm$^2$.

When the thus obtained photosensitive lithographic printing plate as exposed in the same procedure as in Example 4 and then developed with a commercially available additive type developer (ENVIROTECH DEVELOPER RED manufactured by Western Lithotech Co.), a clear red image was obtained. The exposure energy required for obtaining the third step solid print was 25 mj/cm$^2$.

Example 7

A brush-grained plate coated with a lower light-sensitive layer in the same procedure as in Example 4 was prepared. A photosensitive composition containing 1 g of a phenoxy resin (EPONOL 55L32, manufactured by Shell Co.) and 25 mg of the diazo resin hexafluoro phosphate salt prepared as in (b) above, dissolved in 100 ml of methyl cellosolve, was coated thereover by a whirl coater, to form an upper photosensitive layer with a thickness of 2.5 mg/dm$^2$. When the thus obtained photosensitive lithographic printing plate was exposed as in Example 4 and developed with a commercially available additive type developer (ENVIROTECH DEVELOPER RED manufactured by Western Lithotech Co.), a clear red image was obtained and the exposure energy required for obtaining the third step solid print was 12 mj/cm$^2$.

The foregoing results are shown in Table 1.

By using the lithographic printing plate according to the present invention, it is possible to obtain a lithographic printing plate which can remarkably shorten the exposure time, is suitable for projection exposure, and to which existing developer and automatic developing machines used at present can be applied.

Obviously, numerous modifications and variations of the present invention are possible in light of the above teachings. It is therefore to be understood that within the scope of the appended claims, the invention may be practiced other than as specifically described herein.

What is claimed as new and desired to be secured by Letters Patent of the United States is:

1. A negative photosensitive lithographic printing plate, comprising:

a photosensitive layer comprising upper and lower layers containing photosensitive material, each layer containing a photosensitive diazo resin, on a support having a hydrophilic surface, wherein the photosensitive material in the upper layer consists essentially of an organic solvent-soluble diazo resin and the photosensitive material in the lower layer consists essentially of a water-soluble diazo resin, and the concentration of the organic solvent-soluble diazo resin in the upper layer is not more than ⅓ of the concentration of the water-soluble diazo resin in the lower layer, the thickness of the upper layer is not less than three times the thickness of the lower layer, and the upper layer contains an oleophilic non-photosensitive resin with a weight average molecular weight ranging from 10,000 to 150,000.

2. The lithographic printing plate of claim 1, wherein the oleophilic non-photosensitive resin is selected from the group consisting of polyesters, polyurethanes, polyvinyl butyrals, epoxy resins, polyacrylates, polymethacrylates, polystyrenes, novolacs and cellulose acetates.

3. The lithographic printing plate of claim 2, wherein the oleophilic non-photosensitive resin is a polyacrylate copolymer comprising alkyl acrylate and alkyl methacrylate monomer units.

4. The lithographic printing plate of claim 1, wherein said oleophilic non-photosensitive resin has a molecular weight ranging from 10,000 to 100,000.

5. The lithographic printing plate of claim 1, wherein the concentration of the diazo resin in the upper layer is not more than 20 wt. % of the upper layer and the concentration of the diazo resin in the lower layer is more than 10 wt. % of the lower layer.

TABLE 1

| | Upper Layer | | Lower Layer | | Ratio of the thickness (upper/lower) | Ratio of the concentration (upper/lower) | The exposure energy (mj/cm$_2$) |
| | thickness (mg/dm$^2$) | diazo resin concentration (wt %) | thickness (mg/dm$^2$) | diazo resin concentration (wt %) | | | |
|---|---|---|---|---|---|---|---|
| Example 4 | 2.0 | 2.4 | 0.6 | 50 | 3.33 | 0.05 | 10 |
| Example 5 | 2.5 | 2.4 | 0.5 | 33.3 | 5.0 | 0.07 | 20 |
| Example 6 | 3.0 | 2.4 | 0.5 | 33.3 | 6.0 | 0.07 | 25 |
| Example 7 | 2.5 | 2.4 | 0.6 | 50 | 4.2 | 0.05 | 12 |
| Comparative Example 6 | 2.0 | 2.4 | 1.5 | 50 | 1.3 | 0.05 | 100 |
| Comparative Example 7 | 0.5 | 2.3 | 0.6 | 50 | 0.8 | 0.05 | Can't Print |

6. The lithographic printing plate of claim 1, wherein the concentration of the diazo resin in the lower layer is 20–100 wt. % of the lower layer.

7. The lithographic printing plate of claim 1, wherein the concentration of the diazo resin in the lower layer is from 50–100 wt. % of the lower layer.

8. The lithographic printing plate of claim 1, wherein the concentration of the diazo resin in the upper layer is from 0.01–10 wt. % of the upper layer.

9. The lithographic printing plate of claim 1, wherein the concentration of the diazo resin in the upper layer is from 0.01 to 5 wt. % of the upper layer.

10. The lithographic printing plate of claim 1, wherein the thickness of the upper layer is within a range from 0.5 to 20 mg/dm$^2$ and the thickness of the lower layer is less than 2 mg/dm$^2$.

11. The lithographic printing plate of claim 1, wherein the thickness of the upper layer is from 1 to 10 mg/dm$^2$.

12. The lithographic printing plate of claim 1, wherein the thickness of the upper layer is from 1 to 6 mg/dm$^2$.

13. The lithographic printing plate of claim 1, wherein the thickness of the lower layer is from 0.01 to 1 mg/dm$^2$.

14. The lithographic printing plate of claim 1, wherein the thickness of the lower layer is from 0.05 to 0.5 mg/dm$^2$.

15. The lithographic printing plate of claim 1, wherein the substrate is an aluminum plate.

16. The lithographic printing plate of claim 15, wherein said substrate has been grained, anodized and subjected to a pore sealing treatment.

17. The lithographic printing plate of claim 1, wherein the concentration of the non-photosensitive resin is less than 50 wt. % in the lower layer and greater than 50 wt. % in the upper layer.

18. The lithographic printing plate of claim 1, wherein the concentration of the non-photosensitive resin is less than 30 wt. % in the lower layer and greater than 70 wt. % in the upper layer.

19. The lithographic printing plate of claim 1, wherein said printing plate has an exposure time of from 1 to 20 seconds.

20. The lithographic printing plate of claim 1, wherein said plate has an exposure time of from 2–5 seconds.

21. The lithographic printing plate of claim 1, wherein said photosensitive layer containing a stabilizer.

22. The lithographic printing plate of claim 1, wherein said photosensitive layer containing a colorant.

23. A method of increasing the sensitivity of a lithographic printing plate having an upper layer and a lower layer containing photosensitive material, each layer containing a photosensitive diazo resin, on a support having a hydrophilic surface, comprising:

coating the hydrophilic surface of the support with a lower layer wherein the photosensitive material in the lower layer consists essentially of a water-soluble diazo resin, and coating the lower layer with an upper layer, wherein the photosensitive material in the upper layer consists essentially of an organic solvent-soluble diazo resin, and wherein the concentration of the organic solvent-soluble diazo resin in the upper layer is not more than ⅓ of the concentration of the water-soluble diazo resin in the lower layer, the thickness of the upper layer is not less than three times the thickness of the lower layer, and the upper layer contains an oleophilic non-photosensitive resin with a weight average molecular weight ranging from 10,000 to 150,000.

24. A method for obtaining an imaged lithographic printing plate comprising the steps of:

exposing to light through an original film by a projection method, a negative photosensitive lithographic printing plate having an upper and lower layer, each layer containing a photosensitive diazo resin, on a support having a hydrophilic surface, wherein the photosensitive material in the upper layer consists essentially of an organic solvent-soluble diazo resin and the photosensitive material in the lower layer consists essentially of a water-soluble diazo resin, and the concentration of the organic solvent-soluble diazo resin in the upper layer is not more than ⅓ of the concentration of the water-soluble diazo resin in the lower layer, the thickness of the upper layer is not less than three times the thickness of the lower layer, and the upper layer contains an oleophilic non-photosensitive resin with a weight average molecular weight ranging from 10,000 to 150,000.

* * * * *